United States Patent [19]

Shiné

[11] Patent Number: 4,868,640
[45] Date of Patent: Sep. 19, 1989

[54] INTEGRATED OPTOELECTRONIC CIRCUIT

[75] Inventor: Toshifumi Shiné, Tokyo, Japan

[73] Assignee: NEC Corporation, Japan

[21] Appl. No.: 150,040

[22] Filed: Jan. 29, 1988

[30] Foreign Application Priority Data

Jan. 30, 1987 [JP] Japan .................... 62-18711

[51] Int. Cl.⁴ ............................. H01L 23/16
[52] U.S. Cl. ......................... 357/75; 357/19;
357/51; 357/70; 357/74; 357/80
[58] Field of Search ............. 357/19, 51, 74, 75,
357/80, 70

[56] References Cited

U.S. PATENT DOCUMENTS 4,561,010 12/1988 Ogihara et al. .................. 357/80
4,616,655 10/1986 Weinberg et al. ................ 357/80

Primary Examiner—William L. Sikes
Assistant Examiner—Georgia Y. Epps
Attorney, Agent, or Firm—Leydig, Voit & Mayer

[57] ABSTRACT

An integrated optoelectronic circuit includes a pair of external terminals through one of which a bias voltage is applied to such an optical device as a light emitting element and a light receiving element and through the remaining one of which an optical current is flowed from the optical device. Each of the external terminals is connected through such a resistor as a thick film element to the optical device. The resistor is electrically cut when a light axis coupling of the optical fiber to the optical device is finished to be adjusted so that the affection of noise carried on the external terminals is reduced to the optical and electronic device.

8 Claims, 2 Drawing Sheets

INTEGRATED OPTOELECTRONIC CIRCUIT

FIELD OF THE INVENTION

The invention relates to an integrated optoelectronic circuit, and more particularly to an integrated optoelectronic circuit in which optimum light axis coupling between an optical fiber and an optical device, such as a light emitting diode, photodiode etc. is obtained.

BACKGROUND OF THE INVENTION

A conventional integrated optoelectronic circuit comprises an optical device, such as a light emitting diode, photodiode etc., mounted on a ceramic substrate, an electronic device also mounted on the ceramic substrate, lead patterns disposed on the ceramic substrate for connecting the optical and electronic devices, an optical fiber, one end of which faces the optical device, and external terminals through which power is supplied to the electronic device and through which the electronic device is connected to ground.

In operation, modulated optical signals are supplied through the optical fiber to, for instance, the photodiode which is supplied with bias current through the lead patterns from the electronic device an output of the photodiode is supplied through the lead patterns to the electronic device. In this situation, optimum light axis coupling between the optical fiber and photodiode is obtained when the maximum output is produced by the electronic device.

On the other hand, optimum light axis coupling between the optical fiber and light emitting diode is obtained when the maximum output is supplied from the optical fiber.

Another conventional integrated optoelectronic circuit comprises an optical device, such as a light emitting diode, photodiode etc., mounted on a ceramic substrate, an electronic device also mounted on the ceramic substrate, led patterns disposed on the ceramic substrate for connecting the optical and electronic devices, an optical fiber, one end of which faces facing the optical device, and external terminals respectively connected to the lead pattern through which a bias voltage is applied to the electronic and optical devices and through which the electronic and optical devices are connected to ground.

In operation, the bias voltage is applied through one of the external terminals to the optical device, while the electronic device is not supplied with power. In a case where the optical device is a light emitting diode, the light emitting diode is operated continuously to emit light which is supplied to the optical fiber. Under such a condition, optimum light axis coupling between the optical fiber and light emitting diode is obtained when an output of the optical fiber is at its maximum. In a case where the optical device is a photodiode, on the other hand, the photodiode is supplied continuously with light from the optical fiber. Under such a condition, optimum light axis coupling between the optical fiber and photodiode is detected by checking output current flowing through the other external terminal from the photodiode.

According to the former conventional integrated optoelectronic circuit, however, there is a disadvantage in that apparatus for modulating input light to be supplied to the optical fiber and for measuring high frequency signals supplied from the electronic device must be prepared.

According to the latter conventional integrated optoelectronic circuit, further, there are disadvantages. The properties of the optical and electronic devices are adversely affected because noise is carried on the external terminals. The ratio between signal and noise (S/N ratio) is also reduced for the same reason. The optimum light axis coupling between the optical fiber and a light receiving device such as a photodiode is difficult to determine because the electronic device produces digital signals which are based on current signals amplified therein.

SUMMARY OF THE INVENTION

Accordingly, it is an object of the invention to provide an integrated optoelectronic circuit in which apparatus for modulating input light and for measuring high frequency signals need not be prepared.

It is a further object of the invention to provide an integrated optoelectronic circuit in which the influence of noise is decreased so that properties thereof are improved.

It is a still further object of the invention to provide an integrated optoelectronic circuit in which optimum light axis coupling between an optical fiber and optical device is easily determined.

According to the invention, an integrated optoelectronic circuit comprises, an optical device for emitting light or producing an optical current in response to a bias voltage applied thereto, an electronic device connected through lead patterns to said optical device, an optical fiber for optically coupling said optical device, at least a pair of eternal terminals each connected through a lead pattern to said optical device, for applying a bias voltage to said optical device, and resistance elements each positioned between said optical device and said pair of said external terminals, wherein each of said resistance elements maybe electrically opened after adjustment of the light axis coupling of said optical fiber to said optical device.

BRIEF DESCRIPTION OF THE DRAWINGS

The invention will be explained in more detail in conjunction with following drawings wherein.

DESCRIPTION OF PREFERRED EMBODIMENTS

Figure 1:
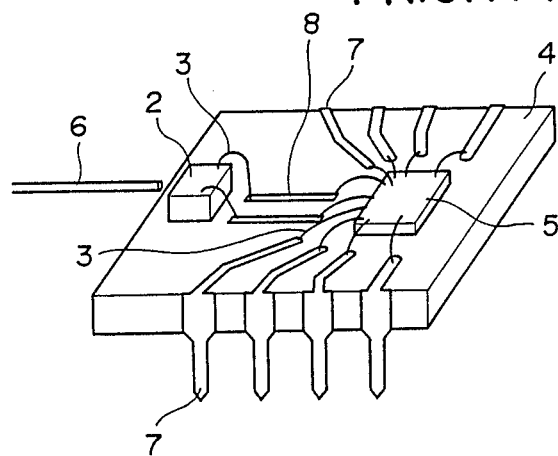
FIG. 1 is a perspective view illustrating a conventional integrated optoelectronic circuit.
Figure 2:
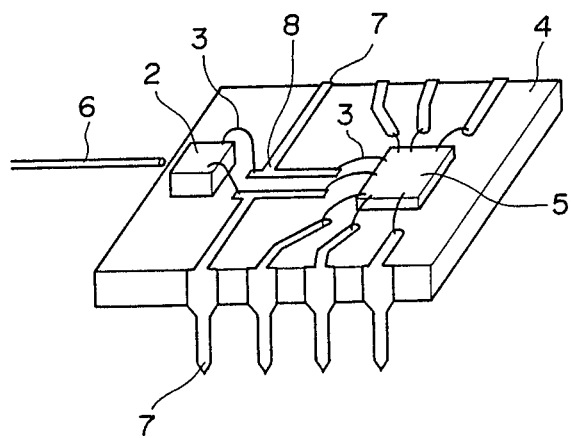
FIG. 2 is a perspective view illustrating another conventional integrated optoelectronic circuit.

Before explaining an integrated optoelectronic circuit in a preferred embodiment according to the invention, the aforementioned conventional integrated optoelectronic circuits are described conjunction with FIGS. 1 and 2.

In FIG. 1, there is shown one of the conventional integrated optoelectronic circuits which comprises an optical device 2 such as a light emitting diode, photodiode etc. mounted on a ceramic substrate 4 an electronic device 5 is also mounted on the ceramic substrate 4 with external terminals 7 disposed on and extending to the edges of the ceramic substrate 4. Lead patters 8 lie between the optical and electronic devices 2 and 5 on the ceramic substrate 4. An optical fiber 6 faces one end of the optical device 2. The lead patterns 8 are connected to the optical and electronic devices 2 and 5 by bonding wires 3, and the external terminals 7 are connected to the electronic device 5 by bonding wires 3.

In the integrated optoelectronic circuit shown in FIG. 1, one of the external terminals 7 is connected to a power source (not shown), while the other external terminal 7 is connected to ground (not shown) so that a predetermined voltage is applied to the electronic device 5. A bias current is supplied from the electronic device 5 through the lead patterns 8 to the optical device 2, while an output of the optical device 2 is supplied through the lead pattern 8 to the electronic device 5. In a case where the optical device 2 is, for instance, a light emitting diode, the light axis coupling between the optical fiber 6 and light emitting diode 2 is adjusted in accordance with an output of the optical fiber 6. In a case where the optical device 2 is, for instance, a photodiode, on the other hand, the light axis coupling is adjusted in accordance with an output of the electronic device 5.

In FIG. 2, there is shown another conventional integrated optoelectronic circuit wherein like parts are indicated by like reference numerals from FIG. 1, except that the external terminals 7 are directly connected to the lead pattern 8.

In the integrated optoelectronic circuit shown in FIG. 2, a bias voltage is applied to the optical device 2 from external terminals 7, while the electronic device 5 is not in an active state. In a case where the optical device 2 is, for instance, a light emitting diode, optimum light axis coupling between the optical fiber 6 and light emitting diode 2 is obtained when an output of the optical fiber 6 is at its maximum while the light emitting diode 2 is continuously operated. In a case where the optical device 2 is for instance, a photodiode, the optimum light axis coupling is determined by detecting the current flowing through external terminals 7 while light is continuously supplied from the optical fiber 6 to the optical device 2.

Figure 3:
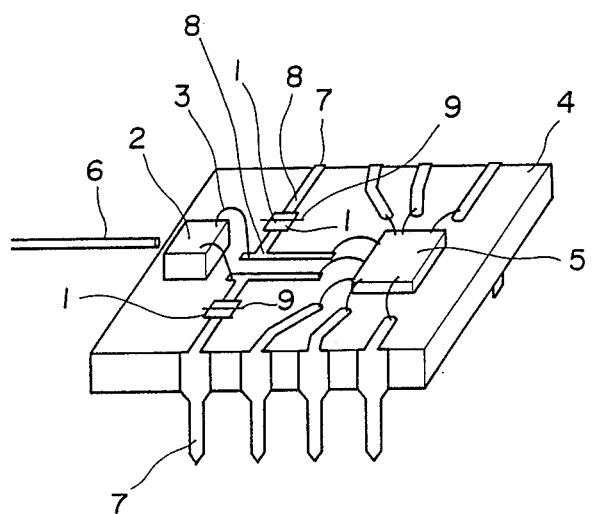
FIG. 3 is a perspective view illustrating an integrated optoelectronic circuit in an embodiment according to the invention.
Figure 4:
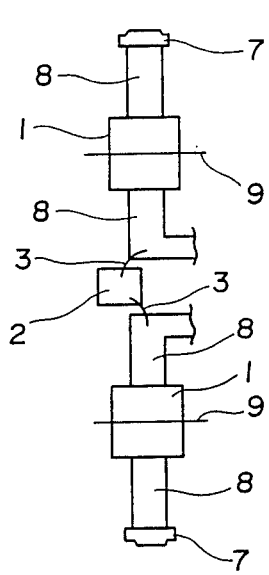
FIG. 4 is a plan view showing a part of the integrated optoelectronic circuit in the embodiment of FIG. 3.
Figure 5:
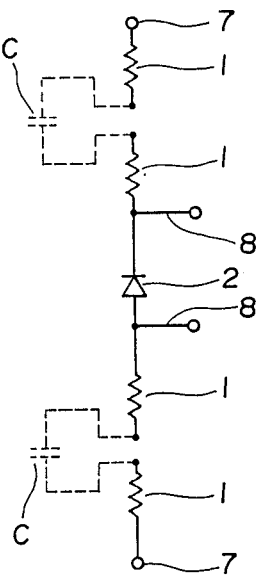
FIG. 5 is an equivalent circuit of the integrated optoelectronic circuit in the embodiment of FIG. 3.

Next, an integrated optoelectronic circuit in an embodiment according to the invention will be explained in conjunction with FIGS. 3 to 5. FIGS. 3 and 4 show an integrated optoelectronic circuit which comprises an optical device 2, such as a light emitting diode, photodiode etc., mounted on a ceramic substrate 4, and electronic device 5 also mounted on the ceramic substrate 4. External terminals 7 are disposed on and extend to the edges of the ceramic substrate 4. Lead patterns 8 between the optical and electronic devices 2 and 5 are disposed on the ceramic substrate 4, and one end of an optical fiber 6 faces the optical device 2. The lead pattern 8 is connected to the optical and electronic devices 2 and 5 by bonding wires 3 and to two external terminals 7 through thick film resistors 1. After optimizing optical coupling the lead patterns 8 are severed at the thick film resistors 1 by a laser light applied along cutting lines 9.

In operation, a bias voltage is applied to external terminals 7 through the thick film resistors 1, lead patterns 8 and bonding wires 3 to the optical device 2, while the electronic device 5 is inactive. In a case where the optical device 2 is for instance, a light emitting diode, optimum light axis coupling between the optical fiber 6 and light emitting diode 2 is obtained when output light from the optical fiber 6 is at its maximum while the light emitting diode 2 is continuously operated. In a case where the optical device 2 is, for instance, a photodiode, on the other hand, output current flowing through the external terminals 7 from the photodiode 2 is detected so that optimum light axis coupling between the photodiode 2 and optical fiber 6 can be achieved while light is continuously supplied from the optical fiber 6 to the photodiode 2.

After the light axis coupling adjustment is completed, the thick film resistors 1 are cut with a laser light beam as shown by the cutting lines 9. In a case where the optical device 2 is, for instance, a light emitting diode, the thick film resistor value is equal to the internal resistance of the light emitting diode when the light emitting diode is emitting light. In a case where the optical device 2 is, for instance, a photodiode, the thick film resistor value is larger than the input impedance of an amplifier which is connected to the photodiode. As a result, the equivalent circuit shown in FIG. 5 is obtained where like parts are indicated by the same reference numerals as in FIGS. 3 and 4. For this reason, the noise at the external terminals 7 affecting the optical and electronic devices 2 and 5 is decreased due to the resistance of the thick film resistors 1, even though the severed resistor halves 1 facing each other across the cutting lines 9 are coupled by capacitors C. Further, the capacitance of the capacitors C is greatly decreased compared to a structure in which the thick film resistors 9 are not provided. This result is achieved because the separation between the lead patterns 8 resulting from the cutting of resistors 1 is larger then if no thick film resistors are used. When no thick film resistor is provided, the separation between leads 8 is smaller resulting in higher capacitance. With smaller lead separation the noise reduction effect is decreased even if the lead pattern is severed.

Although the invention has been described with respect to a specific embodiment for complete and clear disclosure, the appended claims are not to thus limited but are to be constructed as embodying all modifications and alternative constructions that may occur to one skilled in the art and which fairly fall within the basic teaching herein set forth.

What is claimed is:

1. An integrated optoelectronic circuit comprising:
   a substrate on which electrical leads are disposed;
   an electro-optical device for emitting light in response to a bias voltage applied thereto mounted on said substrate and electrically connected to said leads;
   an electronic device mounted on said substrate and electrically connected through said leads to said electro-optical device;
   a pair of external terminals extending from the substrate and electrically connected through said leads to said electro-optical device for applying the bias voltage to said electro-optical device; and
   resistance elements disposed on said substrate respectively electrically connecting each of said external terminals with said leads, said resistance elements being severable to disconnect said external terminals from said leads after adjustment of light coupling between an optical fiber and said electro-optical device.

2. An integrated optoelectronic circuit according to claim 1 wherein each of said resistance elements is a thick film resistor.

3. An integrated optoelectronic circuit according to claim 1 wherein said substrate is a ceramic substrate.

4. An integrated optoelectronic circuit according to claim 1 wherein said electro-optical device is a light emitting diode.

5. An integrated optoelectronic circuit comprising:
a substrate on which electrical leads are disposed;
an electro-optical device for producing an electrical current in response to the application of light thereto mounted on said substrate and electrically connected to said leads;
an electronic device mounted on said substrate and connected through said leads to said electro-optical device;
a pair of external terminals extending from the substrate and electrically connected through said leads to said electro-optical device for monitoring the electrical current produced by said electro-optical device in response to the application of light; and
resistance elements disposed on said substrate respectively electrically connecting each of said external terminals with said leads, said resistance elements being severable to disconnect said external terminals from said leads after adjustment of light coupling between an optical fiber and said electro-optical device.

6. An integrated optoelectronic circuit according to claim 5 wherein each of said resistance elements is a thick film resistor.

7. An integrated optoelectronic circuit according to claim 5 wherein said substrate is a ceramic substrate.

8. An integrated optoelectronic circuit according to claim 5 wherein said electro-optical device is a photodiode.

* * * * *